United States Patent
Wieloch

[11] Patent Number: 6,031,723
[45] Date of Patent: Feb. 29, 2000

[54] INSULATED SURFACE MOUNT CIRCUIT BOARD CONSTRUCTION

[75] Inventor: Christopher J. Wieloch, Brookfield, Wis.

[73] Assignee: Allen-Bradley Company, LLC, Milkwaukee, Wis.

[21] Appl. No.: 08/292,491

[22] Filed: Aug. 18, 1994

[51] Int. Cl.[7] .................................. H05K 7/20
[52] U.S. Cl. ..................... 361/719; 174/52.2; 257/713; 257/724; 361/761
[58] Field of Search .................. 165/80.3, 185; 257/706, 712, 713, 717, 723, 675, 724; 174/16.3, 52.2, 252; 361/707, 704, 709, 710, 717–719, 761, 764, 792, 795

[56] References Cited

U.S. PATENT DOCUMENTS

| | | |
|---|---|---|
| 3,760,090 | 9/1973 | Fowler . |
| 4,630,172 | 12/1986 | Stenerson et al. . |
| 4,649,417 | 3/1987 | Burgess ..................... 361/764 |
| 4,729,061 | 3/1988 | Brown ..................... 361/719 |
| 4,731,701 | 3/1988 | Kuo ..................... 361/764 |
| 4,861,272 | 8/1989 | Clark . |
| 4,964,019 | 10/1990 | Belanger, Jr. ..................... 361/401 |
| 5,041,899 | 8/1991 | Oku et al. . |
| 5,045,642 | 9/1991 | Ohta et al. . |
| 5,155,661 | 10/1992 | Nagesh ..................... 361/715 |
| 5,173,844 | 12/1992 | Adachi ..................... 361/414 |
| 5,182,632 | 1/1993 | Bechtel ..................... 257/713 |
| 5,285,352 | 2/1994 | Pastore ..................... 361/707 |
| 5,297,006 | 3/1994 | Mizukoshi ..................... 361/704 |
| 5,306,874 | 4/1994 | Biron . |
| 5,357,674 | 10/1994 | Lumbard ..................... 29/843 |

*Primary Examiner*—Gerald Tolin
*Attorney, Agent, or Firm*—Joseph N. Ziebert; John J. Horn; John M. Miller

[57] ABSTRACT

A multilayer circuit board or laminated circuit board includes an insulated mounting area for a surface mount package. The mounting area is provided in a recess or portion of the circuit board where the circuit board is only a single layer thick. The insulated mounting area is provided in a blind via in the multilayer circuit board. The insulating medium associated with the single layer provides a heat conductive yet highly electrically insulative mounting area for a heat sink. The heat sink may be mounted on a side opposite the electrical device. The heat sink may be a standard heat sink or a copper coil directly soldered to the circuit board. The heat sink mounting advantageously eliminates the need for bolts, nuts, brackets, and an additional insulating layer necessary to insulate power semiconductor components.

12 Claims, 3 Drawing Sheets

INSULATED SURFACE MOUNT CIRCUIT BOARD CONSTRUCTION

FIELD OF THE INVENTION

The present invention relates to a laminated or multilayer circuit board, and more particularly to a multilayer circuit board including a mounting area configured to facilitate heat dissipation from a high power electrical device.

BACKGROUND OF THE INVENTION

In general, multilayer circuit boards are utilized in high power applications such as motor controllers, computers, power supplies, or other control devices. Typically, these boards include high-power electrical devices such as resistors and semiconductors to perform the functions required by the associated applications. As a result, these electrical devices often generate a significant amount of heat, and require heat sinks or other thermal management systems to prevent the circuit boards and electrical devices from overheating.

Heat sinks are typically metal components relatively large in size and secured to circuit boards or associated electrical devices to enhance heat dissipation therefrom. In particular, heat sinks are attached to a thermally and electrically conductive portion of an electrical device. For example, heat sinks are often secured directly to the lead frame of the device with hardware such as brackets, bolts, or other mountings. This additional hardware is expensive and increases the assembly time for the circuit board. The heat sinks frequently are electrically isolated from the lead frame with a heat conducting, electrically insulating layer of film or other material which is placed between the electrical device and the heat sink. Such a layer is disadvantageous because installing the layer increases the assembly time for the circuit board. Furthermore, the integrity of the layer is very difficult to inspect.

Some electrical devices are packaged as surface mount devices which utilize a minimum amount of space on the circuit board. However, higher power surface mount devices must be mounted on or near large pads or sections of the metal layer on the circuit board to provide adequate heat dissipation. These large sections are disadvantageous because the space required by the large sections could otherwise be utilized by other electrical components. To reduce the size of these large sections, surface mount devices are often mounted on circuit boards made from ceramic or other materials which have a high thermal capacity. Drawbacks with ceramic circuit boards include their expense and weight.

Thus, there is a need for a multilayer circuit board having an insulated mounting area for a surface mount device and a heat sink. There is also a need for a low cost insulated mounting for a heat sink which requires a small amount of board space and is thermally conductive.

SUMMARY OF THE INVENTION

The present invention relates to a multilayer circuit board including a first circuit board layer and a second circuit board layer. The top surface of the first circuit board layer has a pad for an electrical device, and the bottom surface of the first circuit board layer has a heat sink area opposite the pad. The second circuit board layer is adhered to the first circuit board layer and is configured so that the pad is exposed.

The present invention also relates to a method of manufacturing a laminated circuit board. The method comprises the steps of placing a footprint (i.e. electrical device mounting area) on a top surface of a first board layer, attaching a second board layer to the top surface of the first board layer, and configuring the second board layer so that the footprint is not covered by the second board layer.

The present invention further relates to a multilayer circuit board including a plurality of circuit board layers. The multilayer circuit board is improved by providing a mounting area for an electrical device located on the top surface of the multilayer circuit board. The circuit board layers are configured to have only one layer of the plurality of the circuit board layers between the top surface and the bottom surface at the mounting area.

The present invention further relates to a laminated circuit board upon which a semiconductor device and heat sink are mounted, the laminated circuit board includes a mounting layer and at least one additional layer. The mounting layer has a pad configured for the semiconductor device on a first side and a heat sink area for the heat sink on a second side. The at least one additional layer has an aperture over the heat sink area and the pad.

The present invention advantageously allows an electrical device and a heat sink to be mounted on a multilayer circuit board without the use of bolts, brackets, or other hardware. In one aspect of the present invention, the multilayer circuit board has an insulated mounting for a surface mount device and a heat sink on a portion of the circuit board which has only a single layer. The mounting utilizes the inherent electrical isolation provided by the high dielectric content of the circuit board and yet the thin layer provides acceptable heat transmission.

In another aspect of the invention the heat sink can be soldered directly to the single layer on an opposing side from the electrical device, thereby providing a superior heat transmission media at a very low cost and using only a minimal amount of board space. The present invention advantageously does not require the use of an additional insulating layer between the heat sink and the electrical device.

BRIEF DESCRIPTION OF THE DRAWINGS

Preferred embodiments of the invention will hereinafter be described in conjunction with the appended drawings, where like numerals denote like elements and.

DETAILED DESCRIPTION OF PREFERRED EXEMPLARY EMBODIMENTS

Figure 1:
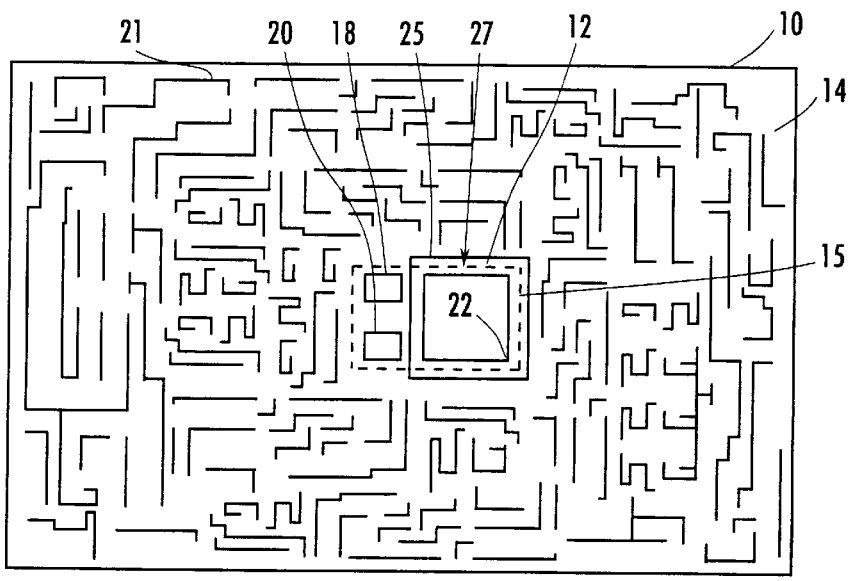
FIG. 1 is a top view of a multilayer circuit board according to a first embodiment of the present invention.

FIG. 1 shows a laminated or multilayer circuit board 10 in accordance with the present invention. Multilayer circuit board 10 is comprised of a mounting layer 12 and at least one additional layer 14. Board 10 includes a footprint 15 for an electrical device (not shown in FIG. 1) which may be soldered or attached to board 10.

Footprint 15 includes a pad 18, a pad 20 and a pad or a contact area 22. Contact area 22 is preferably located on top of mounting layer 12. Pads 18 and 20 are preferably mounted on top of layer 14. Alternatively, board 10 may be configured such that pads 18 and 20 are mounted on layer 12, or on any additional layer between layers 12 and 14.

A blind via or recess 27 is provided in multilayer circuit board 10 by fabricating (e.g. machining, molding, etching) an aperture 25 in layer 14 to expose contact area 22. In the manufacture of circuit boards, channels which are fabricated into, but not completely through, a multilayer circuit board are commonly referred to as "blind vias." Aperture 25 may be fabricated before or after layer 14 is secured (e.g. adhered) to layer 12.

Figure 2:
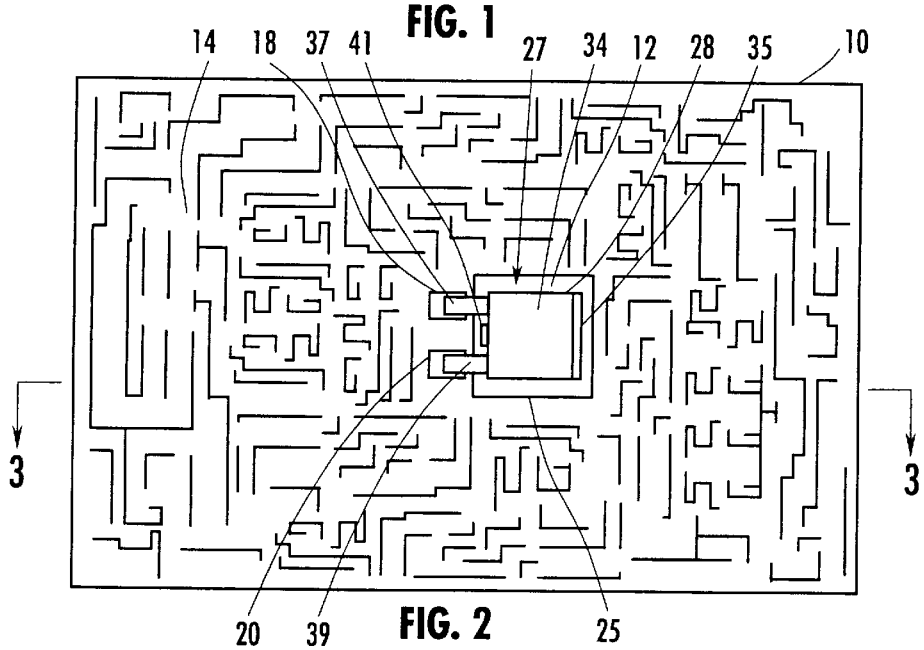
FIG. 2 is a top view of the multilayer circuit board illustrated in FIG. 1 including a surface mounted semiconductor device.
Figure 3:
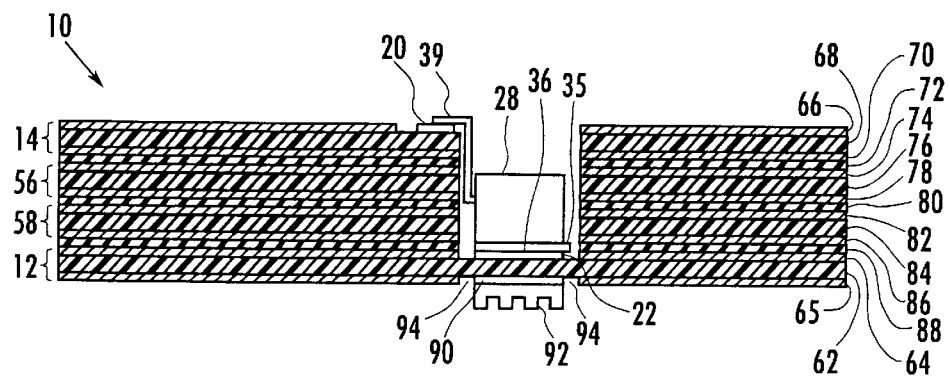
FIG. 3 is a cross sectional view along line 3—3 in FIG. 2.

With reference to FIGS. 2 and 3, circuit board 10 includes a surface mount electrical device 28 mounted on contact area 22 of board 10 within recess 27. Electrical device 28 is preferably a power semiconductor device such as a voltage regulator, power transistor, diode, op-amp, IGBT, thyristor, SCR, or triac. Electrical device 28 may also be a resistor, or other power component requiring relatively high heat dissipation. Device 28 is preferably packaged in a surface mount package such as a D pack, D2 pack, D3 pack, ICE pack, or other high density board mounting package.

Device 28 is housed in a plastic package or other casing 34 and includes a lead frame 35 and leads 37, 39, and 41. Leads 37 and 39 are preferably soldered to pads 18 and 20, respectively. Lead 41 is preferably electrically coupled to lead frame 35. An underside 36 of lead frame 35 preferably provides a mounting surface which can be advantageously mechanically and/or electrically connected (e.g. reflow soldered, wave soldered) to contact area 22.

With reference to FIG. 3, board 10 is comprised of layer 14, a layer 56, a layer 58, and layer 12. Layer 14 is a double sided printed circuit board layer including an insulating layer 68 attached to thin conductive or metal layers 66 and 70. Layer 56 is a double sided printed circuit board layer including an insulating layer 76 attached to thin conductive or metal layers 74 and 78. Layer 58 is a double sided printed circuit board layer including an insulating layer 84 attached to thin conductive or metal layers 82 and 86. Layer 12 is a double sided printed circuit board layer including an insulating layer 62 attached to thin conductive or metal layers 64 and 65. Metal layers 66, 70, 74, 78, 82, 86, 64 and 65 are preferably copper, silver, conductive inks, aluminum or other conductive materials which are etched or deposited to provide conductors such as printed circuit board conductors 21 (FIG. 1).

Insulating layers 68, 76, 84 and 62 are preferably glass reinforced epoxy, GR4, FR4, paper mica, Teflons flural polymer or other insulating materials. Preferably, insulating layer 72 is provided between layers 14 and 56, insulating layer 80 is provided between layers 56 and 58, and insulating layer 88 is provided between layers 58 and 12. Insulating layers 72, 80 and 88 prevent printed circuit conductors such as printed circuit conductors 21 from shorting with printed circuit conductors of other layers. Metal layer 64 on top of layer 12 is etched or deposited to provide contact area 22. Metal layer 65 on the bottom of layer 12 is etched or deposited to provide a heat sink area 90. Metal in areas 94 is etched out to electrically isolate heat sink area 90 from the remainder of metal layer 65.

Heat sink area 90 preferably allows a heat conductive component such as a heat sink 92 to be soldered directly to layer 12. Heat sink 92 is preferably a copper, aluminum, or other heat conductive material designed for dissipating heat. Heat sink 92 can also be a lightweight copper coil assembly or industry standard heat sink such as those manufactured by Thermalloy, Inc. or E&G Wakefield Engineering. Heat sink area 92 advantageously allows thin copper coils, which ordinarily cannot be utilized with standard heat sink mountings, to be attached to board 10 as heat sink 92. Heat sink 92 may also be reflow soldered, wave soldered or otherwise attached to board 10. Solder provides a highly heat conductive medium for attaching heat sink 92 to heat sink area 90.

Recess 27 allows heat generated by electrical device 28 to be advantageously transmitted through layer 12 to heat sink 92. Preferably, insulating layer 62 of layer 12 is a thin layer of glass epoxy material approximately 0.009–0.006 inches thick. The dimensions of layer 62 allows heat to be efficiently transmitted from device 28 to heat sink 92. The mounting of device 28 in recess 27 allows device 28 to have an approximate heat rise of 1.5° C./W. The mounting of device 28 in recess 27 also advantageously provides a mounting with a dielectric strength which can withstand over 10,000 volts from device 28 to heat sink 92. The configuration of recess 27 allows heat sink 92 and electrical device 28 to be mounted on board 10 using a minimal amount of assembly time and board space. By way of modification, layer 12 may be fabricated to include channels within area 22 which pass through layer 12. These channels could be filled or coated with solder or another appropriate heat conducting material with a heat conductivity greater than layer 12 to increase heat transmission from device 28 to heat sink 92.

Heat sink 92 and heat sink area 90 may be smaller or larger than footprint 15. The configuration of the mounting having heat sink area 90 on the opposite side of layer 12 from footprint 15 allows an economic use of board space. For example, the relatively bulky heat sink 92 may be mounted on a bottom side of board 10 away from other components such as device 28 mounted on the top side of board 10.

Alternatively, board 10 may be configured to have a single layer mounting area on the top layer of board 10 by providing the recess through the bottom layers of board 10. Also, board 10 may be configured to have the mounting area on an intermediate layer (e.g. 56 or 58) between layers 12 and 14 by providing the recess through the top and bottom layers of board 10.

In a further embodiment, aperture 25 may be eliminated by providing a mounting area close to one end of board 10. Layers 14, 56 and 58 may be sized smaller than layer 12 and shifted to one end so that the single layer mounting area is provided on the opposite end of layer 12. Also, layers 14, 56, and 58 may be comprised of unitary pieces which may be configured on top of layer 12 to form recess 27.

Figure 4:
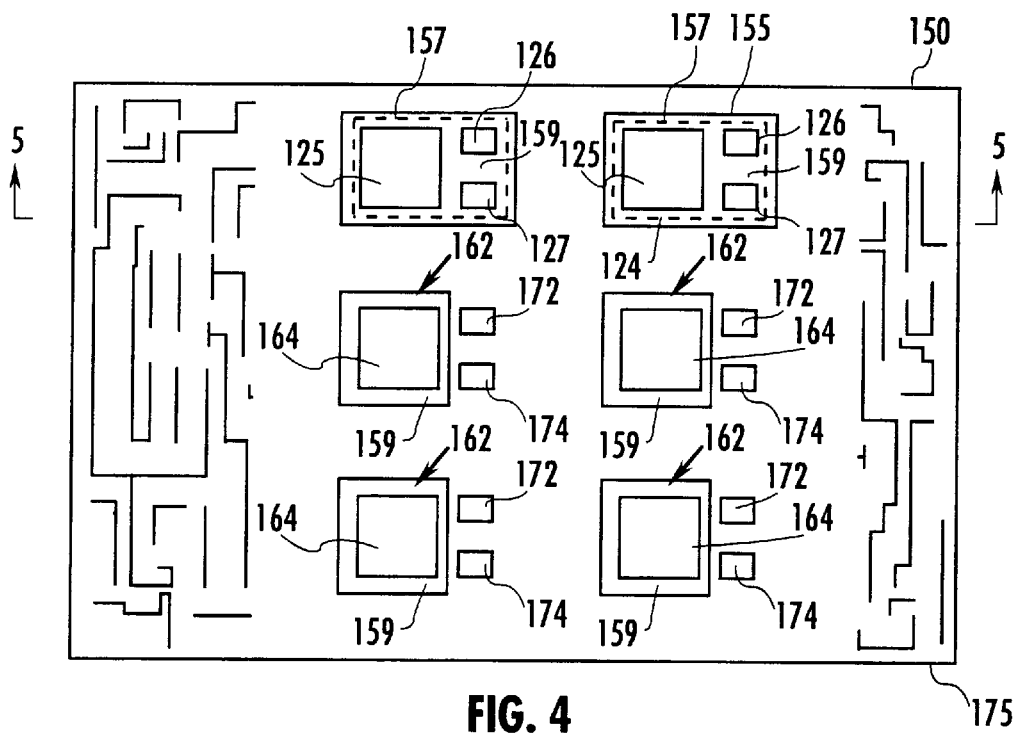
FIG. 4 is a top view of a multilayer circuit board according to a second embodiment of the present invention.

FIG. 4 illustrates another embodiment of a laminated or multilayer circuit board 150 substantially similar to board 10 illustrated in FIG. 1 wherein board 150 includes a number of mounting areas for a number of electrical devices. Board 150 includes blind vias or recesses 155 having entire footprints 157 located within recess 155. Footprint 157 includes pads 126, 127 and a main pad 125. Entire footprints 157 are provided on a bottom layer 159. Board 150 also includes recesses 162 similar to recess 27 (FIG. 1) which have only main pads 164 within recess 162. Pads 172 and 174 are provided on a top surface 175 of board 150.

Figure 5:
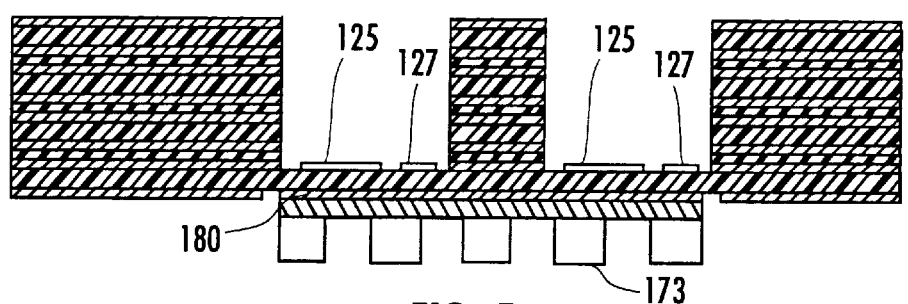
FIG. 5 is a cross sectional view along line 5—5 in FIG. 4.

With reference to FIG. 5, a unitary heat sink area 180 is provided opposite recesses 155 and 162 (FIG. 4). A single heat sink 173 can be attached or soldered to unitary heat sink area 180. Therefore, single heat sink 173 can be advantageously used to enhance heat dissipation for several electrical devices mounted in recesses 155 and 162. Alternatively, heat sink area 180 may be divided into unitary heat sink areas for individual electrical devices.

Figure 6:
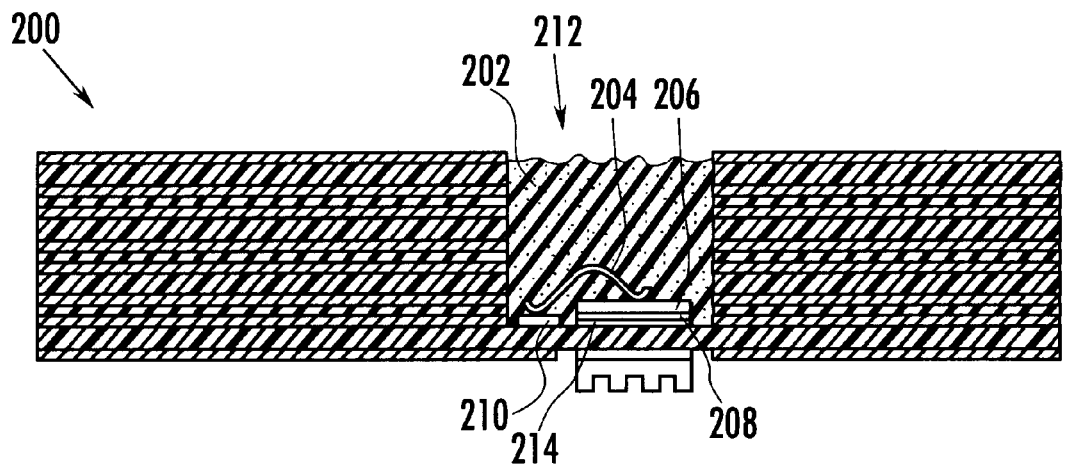
FIG. 6 is a cross sectional view of a multilayer circuit board including a potted semiconductor device according to a third embodiment of the present invention.

FIG. 6 illustrates yet another embodiment of a laminated or multilayered circuit board 200 substantially similar to board 10 illustrated in FIG. 3 wherein board 200 includes a semiconductor die 206 overcoated with a potting compound 202. Board 200 advantageously houses a bare silicon chip such as die 206 in a non-tooled encapsulation. Die 206 is mounted on a contact area 214 of board 200 within a recess 212. Die 206 is preferably a bare silicon die. Die 206 includes a metalized layer 208 (such as aluminum, silver or other conductive material) which can be electrically connected (e.g., soldered, glued using conductive epoxy) to contact area 214. A bond wire 204 is electrically connected between die 206 and pad 210 of board 200. Bond wire 204 is preferably made of aluminum. Board 200 may contain one or more recesses, and each recess may contain one or more dies.

After die 206 and bond wire 204 are in place, they are preferably coated with a soft silicon gel (not shown). A potting compound 202 is used to fill recess 212. Potting compound 202 is a non-tooled encapsulator preferably made of silicone or urethane resin. Potting compound 202 provides environmental protection to die 206, bond wire 204 and pad 210. Potting compound 202 also increases the mechanical strength of the assembly by holding bond wire 204 and die 206 in place.

It is understood that, while the detailed drawings, specific examples, and particular materials given describe a preferred exemplary embodiment of the present invention, they are for the purpose of illustration only. The method or apparatus of the invention is not limited to the precise details and conditions disclosed. For example, although particular surface mount packages and electrical devices are described, the circuit board may be populated with other types of heat producing components. Also, various configurations for a heat sink conducting area may be utilized. Various changes may be made to the details disclosed without departing from the spirit of the invention which is defined by the following claims.

What is claimed is:

1. A multilayer circuit board for receiving a surface mount package having a lead frame, the multilayer circuit board comprising:

a first circuit board layer having a first top surface and a first bottom surface, the first top surface having a surface mount pad for physical and electrical connection to the lead frame, the bottom surface having a heat sink area opposite the surface mount pad; and a second circuit board layer having a second top surface and a second bottom surface, the second bottom surface being attached to the first top surface, the second circuit board layer being configured so that the surface mount pad is exposed, whereby heat is dissipated from the lead frame of the surface mount package through the first circuit board layer to the heat sink area.

2. The multilayer circuit board of claim 1, further comprising a third circuit board layer having a third bottom surface being attached to the second top surface, the third circuit board layer being configured so that the surface mount pad is exposed.

3. The multilayer circuit board of claim 1, wherein the second circuit board layer surrounds the surface mount pad.

4. The multilayer circuit board of claim 1 wherein the first circuit board layer and second circuit board layer are each comprised of an insulating medium located between two conductor layers and the surface mount pad is etched on one of the two conductor layers.

5. The multilayer circuit board of claim 4 wherein an insulating layer is located between the first and second circuit board layers.

6. A laminated circuit board upon which a semiconductor device and heat sink are mounted, the semiconductor device having a lead frame the laminated circuit board comprising:

a single mounting layer having a pad supporting the lead frame of the semiconductor device on a first side and a heat sink area supporting the heat sink on a second side the heat sink area being opposite the pad; and at least one additional layer coupled to the mounting layer, the at least one additional layer having an aperture over the heat sink area or the pad.

7. The laminated board of claim 6 wherein the aperture is a blind via in the laminated board.

8. The laminated board of claim 7 wherein the first side has a plurality of pads which receive a plurality of semiconductor devices and the heat sink area is a single heat sink area disposed on the second side opposite the plurality of pads.

9. The laminated board of claim 8 wherein the plurality of pads are copper.

10. The laminated board of claim 6 wherein the gad on the mounting layer is sized to receive a backplane lead frame.

11. The laminated board of claim 6 wherein the lead frame is is a backplane lead frame and the pad is rectangular.

12. A multilayer circuit board for receiving a surface mount package having a lead frame, the multilayer circuit board comprising:

a first circuit board layer having a first top surface and a first bottom surface, the first top surface having a surface mount pad means for physically receiving the lead frame of the surface mount package, the bottom surface having a heat sink area opposite the surface mount pad means; and a second circuit board layer having a second top surface and a second bottom surface, the second bottom surface being attached to the first top surface, the second circuit board layer having an aperture so that the surface mount pad means is exposed.

* * * * *